(12) United States Patent
Katsunuma

(10) Patent No.: US 12,154,792 B2
(45) Date of Patent: Nov. 26, 2024

(54) PLASMA ETCHING METHOD

(71) Applicant: Tokyo Electron Limited, Tokyo (JP)

(72) Inventor: Takayuki Katsunuma, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 782 days.

(21) Appl. No.: 17/084,938

(22) Filed: Oct. 30, 2020

(65) Prior Publication Data

US 2021/0050222 A1 Feb. 18, 2021

Related U.S. Application Data

(63) Continuation of application No. 16/176,235, filed on Oct. 31, 2018, now Pat. No. 10,854,470.

(30) Foreign Application Priority Data

Nov. 7, 2017 (JP) .................................. 2017-214313

(51) Int. Cl.

| H01L 21/31 | (2006.01) |
|---|---|
| H01J 37/00 | (2006.01) |
| H01J 37/32 | (2006.01) |
| H01L 21/311 | (2006.01) |
| H01L 21/3213 | (2006.01) |
| H01L 21/67 | (2006.01) |

(52) U.S. Cl.
CPC ........ *H01L 21/31144* (2013.01); *H01J 37/00* (2013.01); *H01J 37/32082* (2013.01); *H01J 37/32155* (2013.01); *H01L 21/31116* (2013.01); *H01L 21/32136* (2013.01); *H01L 21/32137* (2013.01); *H01L 21/32139* (2013.01); *H01L 21/67069* (2013.01)

(58) Field of Classification Search
CPC ........... H01J 37/32082; H01J 37/32155; H01J 37/00; H01L 21/31144; H01L 21/67069; H01L 21/31116; H01L 21/32137; H01L 21/32139; H01L 21/32136
See application file for complete search history.

(56) References Cited

U.S. PATENT DOCUMENTS

| 9,543,148 B1 * | 1/2017 | Hudson ............. H01L 21/67069 |
|---|---|---|
| 2004/0173570 A1 | 9/2004 | Ying et al. |
| 2016/0308112 A1 * | 10/2016 | Tan ........................... C23F 4/00 |
| 2017/0125260 A1 | 5/2017 | Tan et al. |
| 2017/0178899 A1 | 6/2017 | Kabansky et al. |

(Continued)

FOREIGN PATENT DOCUMENTS

| JP | 2000-133638 A | 5/2000 |
|---|---|---|
| JP | 2003-282539 A | 10/2003 |

(Continued)

*Primary Examiner* — Yuechuan Yu
(74) *Attorney, Agent, or Firm* — Pearne & Gordon LLP

(57) ABSTRACT

Etching stop which is caused by a metal released from a metal-containing mask can be avoided. A plasma etching method includes a protective film forming process of forming a protective film on a metal-containing film, which is formed on an etching target film and provided with a preset opening pattern, by a first processing gas; and an etching process of etching the etching target film by plasma generated from a second processing gas while using, as a mask, the metal-containing film on which the protective film is formed.

5 Claims, 4 Drawing Sheets

(56) References Cited

U.S. PATENT DOCUMENTS

| | | |
|---|---|---|
| 2017/0229311 A1 | 8/2017 | Tan et al. |
| 2018/0033622 A1 | 2/2018 | Swaminathan et al. |
| 2018/0108529 A1 | 4/2018 | Lee et al. |
| 2018/0358220 A1 | 12/2018 | Yu et al. |

FOREIGN PATENT DOCUMENTS

| | | |
|---|---|---|
| JP | 2012-142495 A | 7/2012 |
| JP | 2014-029981 A | 2/2014 |
| JP | 2016-066593 A | 4/2016 |
| JP | 2017-098323 A | 6/2017 |
| KR | 10-2017-0074777 A | 6/2017 |

* cited by examiner

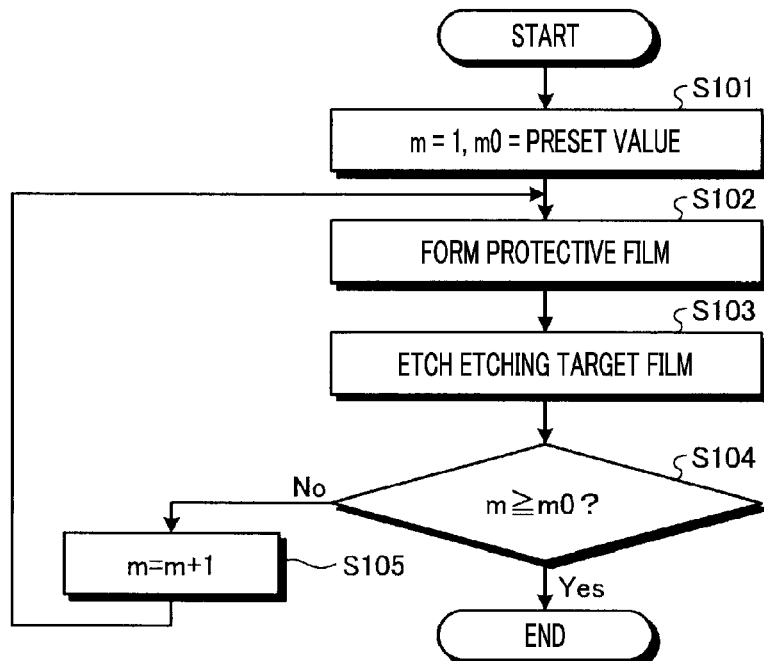

FIG. 6

| | Initial | As LF CW etch | As LF pulse etch |
|---|---|---|---|
| Top view | | | |
| X-section | | | |
| Top CD | 75.91nm | 66.82nm | 70.40nm |
| CD bias | | −9.09nm | −5.51nm |

PLASMA ETCHING METHOD

CROSS-REFERENCE TO RELATED APPLICATION

This is a continuation application of U.S. patent application Ser. No. 16/176,235, filed on Oct. 31, 2018, which claims the benefit of Japanese Patent Application No. 2017-214313 filed on Nov. 7, 2017, the entire disclosures of which are incorporated herein by reference.

TECHNICAL FIELD

The various aspects and embodiments described herein pertain generally to a plasma etching method.

BACKGROUND

Conventionally, there is known a technique of etching an etching target film by using a metal-containing film as a mask. For example, there is known a technique of etching a $SiO_2$ film as an etching target film by plasma generated from a processing gas containing $CF_4$ through a mask made of a metal-containing film. Further, there is also known a technique of etching a Low-k film by using an etching gas such as a gas containing $CH_2F_2/N_2$.

Patent Document 1: Japanese Patent Laid-open publication No. 2003-282539
Patent Document 2: Japanese Patent Laid-open publication No. 2017-098323

In the aforementioned prior arts, however, since a metal released from the metal-containing mask by the etching adheres to the etching target film underneath, a shape of a formed recess is degraded. For example, a critical dimension (CD) of the recess formed by the etching may be diminished, a sidewall of the recess formed by the etching may have a tapered shape, or the etching may be deteriorated. As a result, in the aforementioned prior arts, there is a concern that etching stop may occur.

SUMMARY

In one exemplary embodiment, a plasma etching method includes a protective film forming process of forming a protective film on a metal-containing film, which is formed on an etching target film and provided with a preset opening pattern, by a first processing gas; and an etching process of etching the etching target film by plasma generated from a second processing gas while using, as a mask, the metal-containing film on which the protective film is formed.

In another exemplary embodiment, a plasma etching method includes an etching process of etching an etching target film by plasma generated from a processing gas while using, as a mask, a metal-containing film formed on the etching target film and provided with a preset opening pattern; and a radio frequency power applying process of intermittently applying a radio frequency power for attraction of ions in the plasma for a period during which the plasma is being generated from the processing gas.

According to the plasma etching methods of the exemplary embodiments, the etching stop which is caused by a metal released from the metal-containing mask can be avoided.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a flowchart showing an example flow of a plasma etching processing performed in the plasma etching apparatus according to the first exemplary embodiment;

FIG. 3 is a diagram showing processing results regarding a comparative example 1 and an experimental example 1;

FIG. 6 is a diagram showing processing results regarding a comparative example 2 and an experimental example 2.

DETAILED DESCRIPTION

Figure 1:
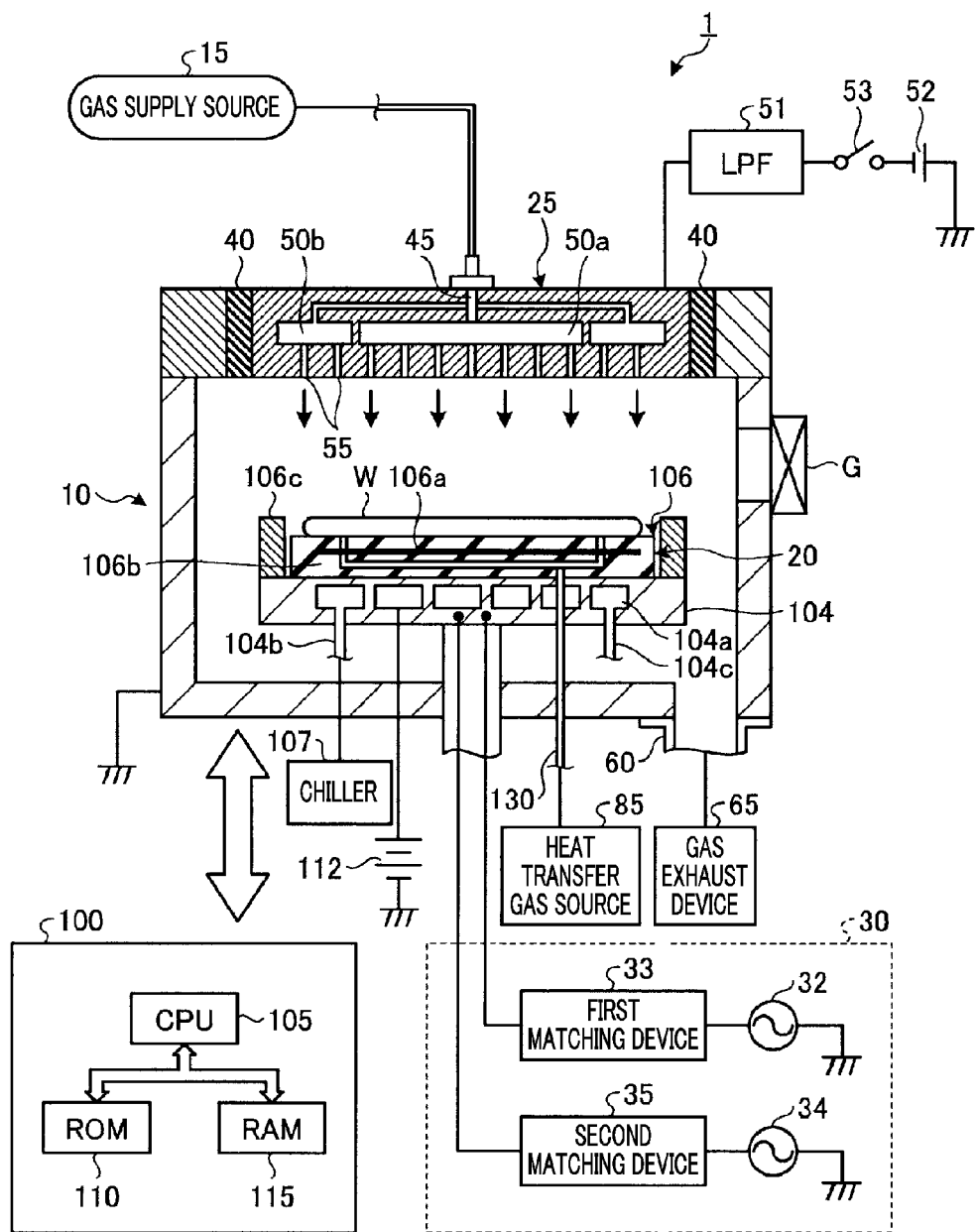
FIG. 1 is a diagram illustrating an example of a longitudinal cross section of a plasma etching apparatus according a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

First Exemplary Embodiment

First, a plasma etching apparatus according to a first exemplary embodiment will be explained with reference to FIG. 1. FIG. 1 is a diagram illustrating an example of a longitudinal cross section of the plasma etching apparatus according to the first exemplary embodiment.

A plasma etching apparatus 1 according to the present exemplary embodiment is configured as a parallel plate type plasma etching apparatus (capacitively coupled plasma etching apparatus) in which a placing table 20 and a gas shower head 25 are placed to face each other within a chamber 10. The placing table 20 has a function of holding a semiconductor wafer (hereinafter, simply referred to as "wafer W") as an example of a processing target object and also serves as a lower electrode. The gas shower head 25 has a function of supplying a gas into the chamber 10 in a shower shape and also serves as an upper electrode.

The chamber 10 is made of, by way of non-limiting example, aluminum having an alumite-treated (anodically oxidized) surface, and has a cylindrical shape. The chamber 10 is electrically grounded. The placing table 20 is provided in a bottom portion of the chamber 10 and configured to place the wafer W.

The placing table 20 is formed of, by way of non-limiting example, aluminum (Al), titanium (Ti), silicon carbide (SiC), or the like. Provided on a top surface of the placing table 20 is an electrostatic chuck 106 configured to attract the wafer W electrostatically. The electrostatic chuck 106 has a structure in which a chuck electrode 106a is embedded in an insulator 106b.

A DC voltage source 112 is connected to the chuck electrode 106a, and a DC voltage is applied from the DC voltage source 112 to the chuck electrode 106a. As a result, the wafer W is attracted to the electrostatic chuck 106 by a Coulomb force.

A conductive focus ring 106c is disposed around the electrostatic chuck 106 (wafer W) to improve etching uniformity. The focus ring 106c is made of, by way of example, but not limitation, silicon.

The placing table 20 is supported by a supporting body 104. A coolant path 104a is formed within the supporting body 104. A coolant inlet pipe 104b and a coolant outlet pipe 104c are connected to the coolant path 104a. A cooling medium such as cooling water or brine outputted from a chiller 107 is circulated through the coolant inlet pipe 104b, the coolant path 104a and the coolant outlet pipe 104c. Accordingly, the placing table 20 and the electrostatic chuck 106 are cooled.

A heat transfer gas source 85 is configured to supply a heat transfer gas such as a helium gas (He) or an argon gas (Ar) to a rear surface of the wafer W on the electrostatic chuck 106 through a gas supply line 130. With this configuration, a temperature of the electrostatic chuck 106 is controlled by the cooling medium circulated in the coolant path 104a and the heat transfer gas supplied to the rear surface of the wafer W.

The placing table 20 is connected with a power supply device 30 configured to supply a dual-frequency superposed power. The power supply device 30 is equipped with a first radio frequency power supply 32 configured to supply a first radio frequency power HF (radio frequency power for plasma generation) having a first frequency; and a second radio frequency power supply 34 configured to supply a second radio frequency power LF (radio frequency power for bias voltage generation) having a second frequency lower than the first frequency. The first radio frequency power supply 32 is electrically connected to the placing table 20 via a first matching device 33. The second radio frequency power supply 34 is electrically connected to the placing table 20 via a second matching device 35. The first radio frequency power supply 32 applies the first radio frequency power HF of, e.g., 40 MHz to the placing table 20. The second radio frequency power supply 34 applies the second radio frequency power LF of, e.g., 13 MHz to the placing table 20. The second radio frequency power LF is a radio frequency power for attraction of ions in plasma and is also called a "bias power." Further, in the present exemplary embodiment, though the first radio frequency power HF is applied to the placing table 20, it may be applied to the upper electrode (gas shower head 25) instead.

The first matching device 33 is configured to match a load impedance with an internal (or output) impedance of the first radio frequency power supply 32. The second matching device 35 is configured to match the load impedance with an internal (or output) impedance of the second radio frequency power supply 34. The first matching device 33 serves to allow the internal impedance of the first radio frequency power supply 32 and the load impedance to be apparently matched with each other when the plasma is generated within the chamber 10. The second matching device 35 serves to allow the internal impedance of the second radio frequency power supply 34 and the load impedance to be apparently matched with each other when the plasma is generated within the chamber 10.

The gas shower head 25 is formed of a silicon-containing material, for example, silicon, and is disposed to close an opening at a ceiling of the chamber 10 with a shield ring 40 therebetween. The shield ring 40 covers a peripheral portion of the gas shower head 25.

The gas shower head 25 is electrically connected with a variable DC power supply 52 via a low pass filter 51 (LPF). The variable DC power supply 52 is connected such that a cathode thereof is on the side of the gas shower head 25, and configured to apply a negative DC voltage to the gas shower head 25. A power feed from the variable DC power supply 52 is turned on/off by an on/off switch 53. The low pass filter 51 is configured to trap the radio frequency powers from the first radio frequency power supply 32 and the second radio frequency power supply 34, and is implemented by, most appropriately, a LR filter or a LC filter. Further, the gas shower head 25 may not be electrically connected with the variable DC power supply 52 but be electrically grounded.

The gas shower head 25 is provided with a gas inlet opening 45 through which a gas is introduced. A center-side diffusion space 50a and an edge-side diffusion space 50b branched from the gas inlet opening 45 are formed within the gas shower head 25. A gas outputted from a gas supply source 15 is supplied into the diffusion spaces 50a and 50b through the gas inlet opening 45. After diffused in the individual diffusion spaces 50a and 50b, the gas is then introduced toward the placing table 20 from a multiple number of gas supply holes 55.

A gas exhaust opening 60 is formed at a bottom surface of the chamber 10, and the inside of the chamber 10 is decompressed by a gas exhaust device 65 which is connected to the gas exhaust opening 60. Accordingly, the inside of the chamber 10 can be maintained at a predetermined vacuum degree. A gate valve G is provided at a sidewall of the chamber 10. The wafer W is carried into/out of the chamber 10 as the gate valve G is opened or closed.

The plasma etching apparatus 1 is equipped with a control unit 100 configured to control an overall operation of the apparatus. The control unit 100 includes a CPU (Central Processing Unit) 105, a ROM (Read Only Memory) 110, a RAM (Random Access Memory) 115, and so forth. The CPU 105 performs a required processing such as plasma etching processing to be descried later based on various kinds of recipes stored in these memory devices. Recorded in the recipes is control information of the apparatus corresponding processing conditions such as a processing time, a pressure (gas exhaust), a radio frequency power and voltage, various gas flow rates, temperatures within the chamber (a temperature of the upper electrode, a temperature of the sidewall of the chamber, a temperature of the electrostatic chuck, etc.), a temperature of the chiller 107, and so forth.

These programs and recipes indicating the processing conditions may be stored in a hard disk or a semiconductor memory. Further, the recipes may be set to a preset position in the memory device while being stored in a computer-readable portable storage medium such as a CD-ROM or a DVD.

By way of example, the control unit 100 controls the individual components of the plasma etching apparatus 1 to perform a plasma etching processing to be described later. As a specific example, the control unit 100 controls the individual components of the plasma etching apparatus 1 to perform a protective film forming process of forming, by a first processing gas, a protective film on a metal-containing film which is formed on the etching target film and provided with a preset opening pattern. Further, the control unit 100 controls the individual components of the plasma etching apparatus 1 to perform an etching process of etching the etching target film by plasma generated from a second processing gas while using, as a mask, the metal-containing film on which the protective film is formed. Here, the etching target film and the metal-containing film are stacked on the wafer W in sequence from the bottom. Further, the protective film forming process and the etching process may be alternately repeated at least twice.

(Plasma Etching Method in First Exemplary Embodiment)

FIG. 2 is a flowchart illustrating an example flow of a plasma etching processing performed in the plasma etching apparatus according to the first exemplary embodiment. As will be described below, the plasma etching apparatus 1 performs a series of processings on the wafer W on which the etching target film and the metal-containing film having the preset opening pattern are stacked in sequence.

Here, the etching target film may be, by way of non-limiting example, a silicon oxide film (e.g., a $SiO_2$ film), a Low-k film, a silicon nitride film (e.g., a $Si_3N_4$ film), a polysilicon film, or the like. The Low-k film may be, but not limited to, a SiOC film or a SiOCH film. The metal-containing film may be, but not limited to, a WC film or a TiN film.

As depicted in FIG. 2, the plasma etching apparatus 1 sets initial values for a parameter m for counting, which is used in repeating a process, and a parameter m0 for the number of repetition. For example, the plasma etching apparatus 1 sets "1" for the parameter m and sets "10" as a preset value for the parameter m0 (process S101). Further, the preset value for the parameter m0 may be any value required. By way of example, when the preset value is "1," each of the protective film forming process and the etching process is performed once, and repetition of these processes is not performed. The parameter m0 may be calculated through a preliminary experiment or the like. Further, the parameter m0 may be decided by measuring a thickness of the etching target film.

Subsequently, the plasma etching apparatus 1 performs a protective film forming process of forming a protective film on the metal-containing film by plasma generated from the first processing gas (process S102). The first processing gas includes, by way of non-limiting example, $C_4F_6$, $C_4F_8$, $C_5F_8$, $CHF_3$, $CH_2F_2$, or $CH_4$. The first processing gas may further include a rare gas, desirably. The rare gas may be, but not limited to, Ar. Furthermore, the first processing gas may include a gas containing C and O. The gas containing C and O may be, but not limited to, CO or $CO_2$. Further, the first processing gas may include a gas containing O.

A more specific example will be explained. The control unit 100 of the plasma etching apparatus 1 controls the gas supply source 15 to supply the first processing gas containing a CF (fluorocarbon)-based gas, a gas containing C and O, a rare gas and a gas containing O into the chamber 10. By way of example, the control unit 100 controls the gas supply source 15 to supply $C_4F_6/CO/Ar/O_2$ as the first processing gas into the chamber 10. Then, the control unit 100 controls the first radio frequency power supply 32 to apply the first radio frequency power HF for plasma generation, and controls the second radio frequency power supply 34 to apply the second radio frequency power LF for ion attraction. At this time, the control unit 100 may connect the variable DC power supply 52 to the gas shower head 25 to allow a preset DC voltage to be applied thereto. Accordingly, a CF-based deposit is formed on the metal-containing film as the protective film.

Subsequently, the plasma etching apparatus 1 performs an etching process of etching the etching target film by plasma generated from the second processing gas while using the metal-containing film having the protective film formed thereon as a mask (process S103). The second processing gas may differ depending on the kind of the etching target film. In case that the etching target film is a silicon oxide film, a Low-k film or a silicon nitride film, the second processing gas may include a CF-based gas having a larger F ratio with respect to C than the CF-based gas included in the first processing gas, for example, $CF_4$ or $C_2F_6$. Further, in case that the etching target film is a polysilicon film, the second processing gas may include, but not limited to, $Cl_2$ or $NF_3$. The second processing gas may further include a rare gas.

A more specific example will be described. The control unit 100 of the plasma etching apparatus 1 controls the gas supply source 15 to supply the second processing gas including the CF-based gas having the larger F ratio with respect to C than the CF-based gas included in the first processing gas into the chamber 10. By way of example, the control unit 100 controls the gas supply source 15 to supply $CF_4/H_2/N_2$ into the chamber 10 as the second processing gas. Then, the control unit 100 controls the first radio frequency power supply 32 to apply the first radio frequency power HF for plasma generation, and controls the second radio frequency power supply 34 to apply the second radio frequency power LF for ion attraction. At this time, the control unit 100 may also control the variable DC power supply 52 to apply the preset DC voltage to the upper electrode (gas shower head 25) connected thereto. As a result, the etching target film is etched, and a recess is formed. The recess may be, for example, a groove or a hole.

Thereafter, the plasma etching apparatus 1 determines whether the protective film forming process and the etching process are repeated a preset number of times. That is, the plasma etching apparatus 1 determines whether the parameter m is equal to or larger than the parameter m0 (process S104). If the parameter m is less than the parameter m0 (process S104: No), the plasma etching apparatus 1 increases the parameter m by 1 (process S105), and returns the processing back to the process S102 to repeat the protective film forming process and the etching process. Meanwhile, if the parameter m is equal to or larger than the parameter m0 (process S104: Yes), the plasma etching apparatus 1 ends the processing.

Effects in First Exemplary Embodiment

According to the first exemplary embodiment as described so far, the protective film is formed on the metal-containing film, which is formed on the etching target film and provided with the preset opening pattern, by the plasma generated from the first processing gas, and the etching target film is etched by the plasma generated from the second processing gas while using the metal-containing film having the protective film formed thereon as the mask. Thus, since the metal-containing film is protected by the protective film, release of the metal from the metal-containing film and adhesion of the metal to the etching target film are suppressed. Therefore, deterioration of the etching by the metal is avoided. As a consequence, a shape of the recess formed by the etching with the metal-containing mask can be improved.

Further, though the above first exemplary embodiment has been described for the example where the protective film forming process and the etching process are performed, the present disclosure is not limited thereto. By way of example, a patterning process of forming the preset opening pattern on the metal-containing film formed on the etching target film by using a mask film provided with the preset opening pattern as a mask may be performed prior to the protective film forming process. The mask film may be a hard mask made of, by way of non-limiting example, a silicon oxide film, a silicon nitride film, a SiON film, a SiC film a SiOC film, or the like.

Further, in case that the mask film is formed on the metal-containing film having the preset opening pattern, a pre-etching process of etching the etching target film until or immediately before at least a part of a top surface of the metal-containing film is exposed may be performed by using the mask film as a mask prior to the protective film forming process. In this case, in the pre-etching process, it is desirable that an etching rate of the mask film is lower than an etching rate of the etching target film. Accordingly, since the etching of the etching target film can be performed until the top surface of the metal-containing film is exposed, a throughput of the etching can be improved. Further, the etching process and the pre-etching process may be performed in the same chamber without breaking the vacuum or performed in different chambers.

Furthermore, in the above-described first exemplary embodiment, a DC voltage DC may be applied to the gas shower head 25 serving as the upper electrode. With the application of this DC voltage, a deposit rate (deposition rate) can be controlled. The DC voltage DC may be a negative DC voltage DC. Further, in the above-described first exemplary embodiment, a magnitude of the DC voltage DC may be changed. Further, in the above-described first exemplary embodiment, the second radio frequency power LF may be a continuous wave or a pulse wave. In case that the second radio frequency power LF is the continuous wave, the etching rate of the etching target layer is improved. In case that the second radio frequency power LF is the pulse wave, a damage on the mask can be reduced and a temperature rise of the wafer W can be suppressed. Furthermore, in case that the second radio frequency power LF is the pulse wave, the second radio frequency power LF may be ON/OFF-controlled or modulated between a High value and a Low value. Moreover, in the above-stated first exemplary embodiment, the frequency and/or the power value (power level) of the second radio frequency power LF may be varied. Through this variation, ion energy is controlled, so that the etching rate can be adjusted. In addition, in the above-described first exemplary embodiment, the frequency and/or the power value of the second radio frequency power LF may be varied based on an etching depth (an elapsed time after the beginning of the etching). Further, in the above-stated first exemplary embodiment, the temperature of the wafer W may be controlled. For example, in the first exemplary embodiment, the temperature of the wafer W may be maintained low (about 20° C. to 60° C.), so that a deposition amount can be increased to reduce the release amount of the metal.

Further, the above first exemplary embodiment has been described for the example where the series of processings are performed on the wafer W on which the etching target film and the metal-containing film provided with the preset opening pattern are stacked in sequence. However, the structure of the wafer W is not limited thereto. By way of non-limiting example, the mask film used in patterning the preset opening pattern on the metal-containing film may remain on the metal-containing film.

Moreover, though the first exemplary embodiment has been described for the example where the protective film is formed on the metal-containing film by the plasma generated from the first processing gas including the CF-based gas, the gas containing C and O, the rare gas and the gas containing O respectively having constant flow rates, the present disclosure is not limited thereto. By way of non-limiting example, while maintaining the flow rate of the CF-based gas constant, the flow rate of the gas containing C and O (e.g., CO) may be varied. If the CO is increased, a reaction of "CF-based gas+CO→COF+CF radicals" may easily occur. Accordingly, radicals having a high C ratio are increased, so that an adhesion amount of the radicals to the metal-containing film is increased. Meanwhile, if the flow rate of the CO is decreased or becomes zero, the radicals having the high C ratio are decreased, so that the adhesion amount of the radicals to the metal-containing film is decreased (the deposition amount into the recess is increased). Further, in the above-descried first exemplary embodiment, the flow rate of the CO may be varied based on the frequency or the magnitude of the second radio frequency power LF. For example, a flow rate ratio of the CO with respect to the whole first processing gas may be increased when the frequency of the second radio frequency power LF is reduced. For another example, the flow rate ratio of the CO with respect to the whole first processing gas may be increased when the power value of the second radio frequency power LF is increased. As a result, since the metal-containing film is more protected, the release of the metal from the metal-containing mask can be further suppressed when performing a high-aspect-ratio etching. Further, in the above-described first exemplary embodiment, the flow rate of the CF-based gas may be varied while maintaining the flow rate of the gas containing C and O constant.

In addition, although the above first exemplary embodiment has been described for the example where the CF-based deposit is formed on the metal-containing film as the protective film by the plasma generated from the first processing gas including the CF-based gas, the present disclosure is not limited thereto. By way of example, a carbon-containing deposit may be formed on the metal-containing film as the protective film by the plasma generated from the first processing gas including a carbon-containing gas. The carbon-containing gas may be, but not limited to, $CH_4$ or $C_3H_6$. As another example, a silicon-containing deposit may be formed on the metal-containing film as the protective film by the plasma generated from the first processing gas including a silicon-containing gas. The silicon-containing gas may be, by way of example, but not limitation, $SiCl_4$ or $SiF_4$.

Moreover, in the above-described first exemplary embodiment, PECVD (Plasma Enhanced Chemical Vapor Deposition) is used as the method of forming the protective film on the metal-containing film. However, the present disclosure is not limited thereto. By way of non-limiting example, ALD (Atomic Layer Deposition) may be used. In the ALD method, a film is formed by repeating formation of an adsorption layer formed by adsorbing a gas and modification of this adsorption layer. For example, as a precursor gas containing silicon is supplied into the chamber 10, atoms or molecules of the precursor gas are adsorbed onto the metal-containing film. Then, the precursor gas which is not adsorbed and the atoms or molecules of the precursor gas excessively adsorbed onto the metal-containing film are removed by a purge gas supplied into the chamber 10. Then, a modifying gas (e.g., an oxygen-containing reactant gas or a nitrogen-containing gas) is supplied into the chamber 10, and plasma is generated from the reactant gas. Then, the adsorption layer in which the atoms or molecules of the precursor gas are adsorbed is exposed to active species of the reactant gas. As a result, a silicon-containing film is formed on the metal-containing film. In the ALD method, by repeating a cycle including the adsorption process and the reaction process multiple times, a film of the atoms or molecules included in the precursor gas is deposited on the metal-containing film layer by layer.

Moreover, the protective film may be formed on the metal-containing film without using the plasma. As an example, the protective film may be formed by thermal CVD or thermal ALD. By way of example, in the thermal ALD method, after an adsorption layer is formed by adsorbing a gas, a protective film is formed by modifying the adsorption layer by heating it. As another example, after adsorbing a precursor gas containing carbon or silicon onto the metal-containing film, a protective film may be formed by heating this metal-containing film. The metal-containing film may be heated at a temperature equal to or less than, e.g., 400° C. After adsorbing this precursor gas onto the metal-containing film, some of the gas which is not adsorbed and some of the gas which is excessively adsorbed may be purged with an inert gas before the adsorption layer is heated.

EXAMPLES

Now, the plasma etching method according to the first exemplary embodiment will be described in further detail with reference to some examples. However, it should be noted that the plasma etching method of the first exemplary embodiment is not limited to the following examples.

Comparative Example 1

In a comparative example 1, the etching process is performed on a processing target object as a sample of the wafer W. As the processing target object, one having the following structure is used. Further, the processing target object is placed on a test substrate on which a $SiO_2$ film is formed, and a WC chip is disposed around the processing target object on the test substrate. The etching process is performed under the following conditions.
(Processing Target Object)
  Etching target film: $SiO_2$ film
  Metal-containing film: WC film
  Mask film: $SiO_2$ film
(Etching Process)
  Processing gas and flow rates: $CF_4/H_2/N_2$=20 sccm/200 sccm/200 sccm
  Pressure: 2.7 Pa (20 mTorr)
  First radio frequency power HF: 200 W, continuous wave
  Second radio frequency power LF: 150 W, continuous wave
  DC voltage applied to upper electrode (gas shower head 25): −150 V, continuous wave
  Processing time: 175 sec Experimental Example 1

In an experimental example 1, after performing the protective film forming process on a processing target object as a sample of the wafer W, the etching process is performed. The protective film forming process and the etching process are repeated ten times alternately. As the processing target object, one having the same structure as that of the comparative example 1 is used. Further, the processing target object is placed on a test substrate on which a $SiO_2$ film is formed, and a WC chip is disposed around the processing target object on the test substrate. The protective film forming process is performed under the conditions as follows. The etching process is performed under the same conditions as those of the comparative example 1 except for a processing time described below.
(Protective Film Forming Process)
  Processing gas and flow rates: $C_4F_6/CO/Ar/O_2$=10 sccm/300 sccm/1000 sccm/8 sccm
  Pressure: 4.0 Pa (30 mTorr)
  First radio frequency power HF: 100 W, continuous wave
  Second radio frequency power LF: 200 W, continuous wave
  DC voltage applied to upper electrode (gas shower head 25): −150 W, continuous wave
  Processing time: 10 sec
(Etching Process)
  Processing time: 10 sec Processing Results Regarding Comparative Example 1 and Experimental Example 1

FIG. 3 is a diagram showing processing results of the comparative example 1 and the experimental example 1. FIG. 3 provides traced diagrams illustrating enlarged images of a top view and a cross section of each of the processing target object before being processed, the processing target object after the etching process in the comparative example 1 is performed, and the processing target object after the protective film forming process and the etching process in the experimental example 1 are alternately repeated ten times. Further, in FIG. 3, "Initial" represents the processing target object before being processed; "As etch," the processing target object after the etching process in the comparative example 1 is performed; and "As cyclic etch," the processing target object after the protective film forming process and the etching process in the experimental example 1 are alternately performed ten times.

Further, in FIG. 3, "Top CD" indicates an opening width of a formed recess, and "CD bias" represents a decrement of the opening width of the recess.

As depicted in FIG. 3, in comparison with the comparative example 1 in which the protective film forming process is not performed, the decrement of the opening width of the recess is found to be diminished in the experimental example 1 in which the protective film forming process is performed. Further, as compared to the comparative example 1, an angle of the sidewall of the recess is found to be closer to a vertical angle in the experimental example 1.

Second Exemplary Embodiment

A second exemplary embodiment pertains to a variation of the plasma etching method. Further, since a plasma etching apparatus 1 according to the second exemplary embodiment has the same configuration as the plasma etching apparatus 1 of the first exemplary embodiment, only distinctive features from the plasma etching apparatus 1 of the first exemplary embodiment will be explained herein.

In the plasma etching apparatus 1 according to the second exemplary embodiment, the control unit 100 controls individual components of the plasma etching apparatus 1 to etch the etching target film by plasma generated from a processing gas having deposition property ("deposition processing gas") while using, as the mask, the metal-containing film which is formed on the etching target film and provided with the preset opening pattern. By controlling the individual components of the plasma etching apparatus 1, the control unit 100 intermittently applies a radio frequency power for attraction of ions in the plasma for a period during which the plasma is being generated from the processing gas. Here, the etching target film and the metal-containing film are stacked on the wafer W in sequence.

(Plasma Etching Method in Second Exemplary Embodiment)

Figure 4:
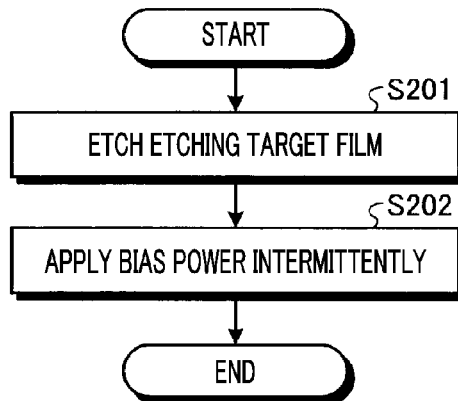
FIG. 4 is a flowchart showing an example flow of a plasma etching processing performed in a plasma etching apparatus according to a second exemplary embodiment.

FIG. 4 is a flowchart illustrating an example flow of a plasma etching processing performed in the plasma etching apparatus according to the second exemplary embodiment. As will be described below, the plasma etching apparatus 1 performs a series of processings on the wafer W on which the etching target film and the metal-containing film provided with the preset opening pattern are stacked in sequence.

Here, the etching target film may be, by way of non-limiting example, a silicon oxide film, a Low-k film, a silicon nitride film or a polysilicon film. The Low-k film is, by way of example, but not limitation, a SiOC film or a SiOCH film. Further, the metal-containing film may be, but not limited to, a WC film or a TiN film.

As depicted in FIG. 4, the plasma etching apparatus 1 performs an etching process of etching the etching target film by the plasma generated from the deposition processing gas while using the metal-containing film as the mask (process S201). The deposition processing gas differs depending on the kind of the etching target film. In case that the etching target film is a silicon oxide film, a Low-k film or a silicon nitride film, the deposition processing gas may include, by way of non-limiting example, $C_4F_6$, $C_4F_8$, $C_5F_8$, $CHF_3$ or $CH_2F_2$. In case that the etching target film is a polysilicon film, the deposition processing gas may include, but not limited to, HBr. Further, the deposition processing gas may include a gas containing C and O. The gas containing C and O may be, by way of non-limiting example, CO or $CO_2$. Furthermore, the deposition processing gas may include a gas containing O. Further, the deposition processing gas may include a rare gas such as Ar.

A more specific example will be described. The control unit 100 of the plasma etching apparatus 1 supplies a processing gas containing, for example, a CF-based gas, a gas containing C and O, a rare gas and a gas containing O into the chamber 10 as the deposition processing gas. For example, the control unit 100 controls the gas supply source 15 to supply $C_4F_6$/CO/Ar/$O_2$ into the chamber 10 as the deposition processing gas. Then, the control unit 100 applies the first radio frequency power HF for plasma generation from the first radio frequency power supply 32, and applies the second radio frequency power LF for ion attraction from the second radio frequency power supply 34. At this time, the control unit 100 may control the variable DC power supply 52 to apply a preset DC voltage to the gas shower head 25 connected thereto. As a result, plasma is generated from the deposition processing gas within the chamber 10, and the etching target film is etched by the generated plasma.

Then, the plasma etching apparatus 1 performs a radio frequency power applying process of applying a radio frequency power for attraction of ions in the plasma intermittently for a period during which the plasma is being generated (process S202).

Figure 5:
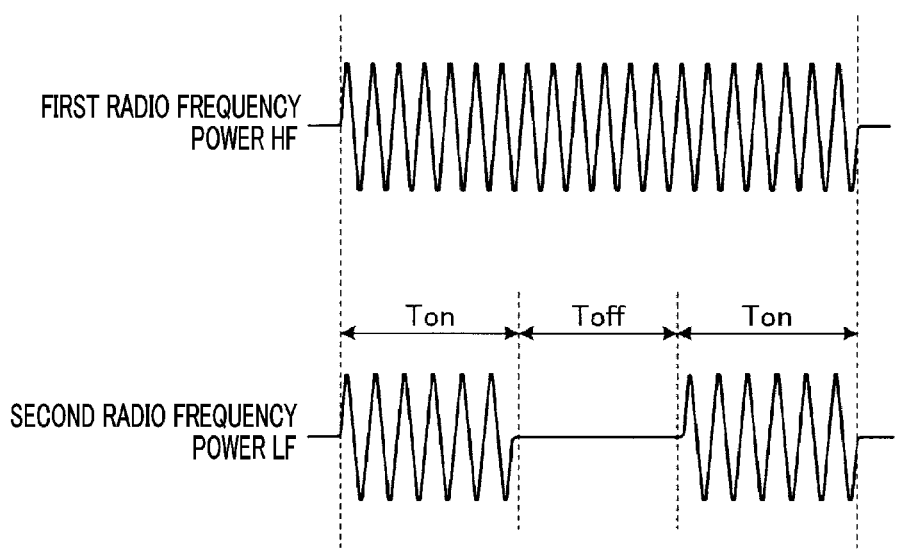
FIG. 5 is a diagram illustrating an example of a radio frequency power applying process according to the second exemplary embodiment.

FIG. 5 is a diagram illustrating an example of the radio frequency power applying process according to the present exemplary embodiment. In the state that the plasma is generated from the processing gas, as shown in FIG. 5, the control unit 100 of the plasma etching apparatus 1 applies the first radio frequency power HF for plasma generation from the first radio frequency power supply 32, and applies the second radio frequency power LF for ion attraction from the second radio frequency power supply 34 intermittently (in a pulse shape). At this time, the control unit 100 may apply the preset DC voltage to the gas shower head 25. In case that the second radio frequency power supply 34 is OFF, a deposit originated from the processing gas is deposited on the metal-containing film as the protective film. If the second radio frequency power supply 34 is switched ON from OFF, the ions in the plasma are attracted into the etching target film, so that the etching of the etching target film progresses. At this time, since the metal-containing film is protected by the deposit, the release of the metal from the metal-containing film is suppressed.

Here, a period during which the second radio frequency power LF is applied is referred to as an on-time "Ton," and a period during which the application of the second radio frequency power LF is stopped is referred to as an off-time "Toff." In this case, in the radio frequency power applying process, the second radio frequency power LF is applied as a pulse wave having a frequency of 1/(Ton+Toff). Further, in the radio frequency power applying process, a duty ratio of the second radio frequency power LF is expressed as Ton/(Ton+Toff).

Further, in the above-described radio frequency power applying process, the frequency of the second radio frequency power LF may be varied based on a depth of the recess (an elapsed time from the beginning of the etching). Further, in the above-described radio frequency power applying process, a power value of the second radio frequency power LF may be varied. As a result, energy of the ions and verticality of the ions can be improved. For example, with a rise of an aspect ratio, the frequency of the second radio frequency power LF may be lowered or the power value of the second radio frequency power LF may be increased. Further, in the above-described radio frequency power applying process, a pulse cycle of the second radio frequency power LF may be varied. As a way to vary the pulse cycle of the second radio frequency power LF, the pulse cycle may be shortened (that is, a pulse frequency may be increased) as a size of the opening is reduced. That is, in a middle and a late stage of the etching, the size of the openings becomes smaller than a design size.

Effects of Second Exemplary Embodiment

According to the second exemplary embodiment as described above, the etching target film is etched by the plasma generated from the deposition processing gas while using the metal-containing film, which is formed on the etching target film and provided with the preset opening pattern, as the mask, and the radio frequency power for attraction of the ions in the plasma (that is, the second radio frequency power LF) is intermittently applied for the period during which the plasma generated from the processing gas exists. That is, when the second radio frequency power LF is not applied, the deposit originated from the processing gas is deposited on the metal-containing film, whereas when the second radio frequency power LF is applied, the etching target film is etched by the plasma generated from the processing gas. Accordingly, since the etching target film is etched while the metal-containing film is protected by the deposit originated from the processing gas, the release of the metal from the metal-containing film is suppressed, so that the deterioration of the etching due to the metal that might be attached to the etching target film can be avoided. As a consequence, the shape of the recess formed by the etching using the metal-containing mask can be bettered.

Further, though the above-described second exemplary embodiment has been described for the example where the etching process and the radio frequency power applying process are performed, the present disclosure is not limited thereto. By way of example, prior to the etching process, a patterning process of forming the preset opening pattern on the metal-containing film formed on the etching target film may be further performed by using a mask film provided with the preset opening pattern as a mask. The mask film may be, by way of non-limiting example, a silicon oxide film, a silicon nitride film, a SiON film, a SiC film or a SiOC film.

Moreover, in case that the mask film is formed on the metal-containing film having the preset opening pattern, a pre-etching process of etching the etching target film until at least a part of a top surface of the metal-containing film is exposed may be performed by using the mask film as a mask before the etching process. In this case, in the pre-etching process, it is desirable that an etching rate of the mask film is equal to or lower than an etching rate of the etching target film. If so, the release of the metal from the metal-containing film under the mask film can be suppressed. In the pre-etching process, the second radio frequency power LF may be a continuous wave or a pulse wave. In case that the second radio frequency power LF is the pulse wave, the second radio frequency power LF may be ON/OFF-controlled or may be modulated between a High value and a Low value. Furthermore, a duty ratio may be changed between the pre-etching process and the etching process. In case of changing the duty ratio, the duty ratio of the pre-etching process may be larger than the duty ratio of the etching process. That is, in case that the mask film exists on the metal-containing film, since the metal-containing film is protected by the mask film, a ratio of applying the second radio frequency power LF may be set to be large.

Moreover, the above second exemplary embodiment has been described for the example where the series of processings are performed on the wafer W on which the etching target film and the metal-containing film provided with the preset opening pattern are stacked in sequence. However, the structure of the wafer W is not limited thereto. By way of non-limiting example, the mask film used in patterning the preset opening pattern on the metal-containing film may remain on the metal-containing film.

In addition, in the above-described second exemplary embodiment, the DC voltage DC may be applied to the upper electrode (gas shower head 25). The DC voltage DC may be a negative DC voltage DC. Further, in the above-described second exemplary embodiment, a continuous wave of the DC voltage DC may be supplied, or the DC voltage may be applied in a pulse shape. Moreover, in the above-described second exemplary embodiment, the second radio frequency power LF may be applied in a pulse shape to be synchronized with another pulse wave. Here, this another pulse wave may be a pulse wave of the second radio frequency power (hereinafter, appropriately referred to as "LF pulse"). In the above-described exemplary embodiment, the negative DC voltage DC may be applied when the LF pulse is not applied, for example. For instance, when the LF pulse is not applied (that is, at a timing when the protective film is formed), positive ions of the rare gas such as argon sputter the upper electrode, and silicon released from the upper electrode reacts with a reactant containing fluorine to be discharged to the outside of the chamber. As a result, the reactant containing the fluorine is reduced, so that the protective film deposition mode works effectively. In addition, in the above-described second exemplary embodiment, an absolute value of the DC voltage DC may be varied with a lapse of time. For example, in the above-described second exemplary embodiment, the DC voltage DC having an absolute value larger than that in the pre-etching process may be applied in the etching process.

Additionally, in the above-described second exemplary embodiment, the duty ratio and/or the frequency of the second radio frequency power LF may be varied. By way of example, the second radio frequency power LF having a certain frequency may be applied in the pre-etching process, and the second radio frequency power LF having a larger frequency than that in the pre-etching process may be supplied in the etching process.

Further, in the above-described second exemplary embodiment, the first radio frequency power HF may be supplied in a pulse shape. By way of example, in the above-described second exemplary embodiment, the first radio frequency power HF may be ON/OFF-controlled or modulated between a High value and a Low value. Furthermore, in the above-described second exemplary embodiment, the pulse wave of the first radio frequency power HF and the pulse wave of the second radio frequency power LF may be synchronized. In addition, in the above-described second exemplary embodiment, the pulse wave of the first radio frequency power HF and the pulse wave of the second radio frequency power LF may not be synchronized.

Moreover, in the above-described second exemplary embodiment, for example, the variable DC power supply 52 may be connected to the gas shower head 25 and a preset DC voltage may be intermittently applied thereto in the radio frequency power applying process. To elaborate, the control unit 100 may pulse-control the second radio frequency power supply 34 and/or the variable DC power supply 52. For example, the control unit 100 may apply the preset DC voltage intermittently by controlling the second radio frequency power supply 34 and the variable DC power supply 52 such that the variable DC power supply 52 is turned ON when the second radio frequency power supply 34 is OFF whereas the variable DC power supply 52 is turned OFF when the second radio frequency power supply 34 is ON. If the variable DC power supply 52 is turned ON when the second radio frequency power supply 34 is OFF, the release amount of silicon from the gas shower head 25 is increased due to collision of ions with the gas shower head 25, so that a silicon-containing deposit is deposited on the metal-containing film as the protective film. Further, the silicon released by the collision of the ions with the gas shower head 25 reacts with the reactant containing the fluorine to be discharged to the outside of the chamber 10, and a carbon-containing deposit is deposited on the metal-containing film as the protective film. As a result, since the metal-containing film is protected by the silicon-containing deposit and the carbon-containing deposit, the release of the metal from the metal-containing film is further suppressed.

Moreover, although the above second exemplary embodiment has been described for the example where the protective film is formed on the metal-containing film by the plasma generated from the processing gas including the CF-based gas, the gas containing C and O, the rare gas and the gas containing O respectively having the constant flow rates in the radio frequency power applying process, the present disclosure is not limited thereto. By way of non-limiting example, while maintaining the flow rate of the CF-based gas constant, the flow rate of the gas containing C and O (e.g., CO) may be varied. If the CO is increased, a reaction of "CF-based gas+CO→COF+CF radicals" may easily occur. Accordingly, radicals having a high C ratio are increased, so that an adhesion amount of radicals to the metal-containing film is increased. Meanwhile, if the flow rate of the CO is decreased or becomes zero, the radicals having the high C ratio are decreased, so that the adhesion amount of the radicals to the metal-containing film is decreased (the deposition amount into the recess is increased). Further, in the above-descried second exemplary embodiment, the flow rate of the CO may be varied based on the frequency or the magnitude of the second radio frequency power LF and the cycle of the pulse wave of the DC voltage DC. For example, a flow rate ratio of the CO with respect to the whole first processing gas may be increased when the frequency of the second radio frequency power LF is reduced. For another example, the flow rate ratio of the CO with respect to the whole first processing gas may be increased when the power value of the second radio frequency power LF is increased. As a result, since the metal-containing film is more protected, the release of the metal from the metal-containing mask can be further suppressed when performing a high-aspect-ratio etching. In addition, if the flow rate ratio of the CO is increased when the DC voltage DC has the High value, for example, an effect of removing F is enhanced, so that the deposition amount on the metal-containing film is increased. If the flow rate ratio of the CO is reduced when the DC voltage DC has the Low value, on the other hand, the effect of removing the F is weakened, so that the deposition amount into the recess is increased. Further, in the above-described second exemplary embodiment, the flow rate of the CF-based gas may be varied while maintaining the flow rate of the gas containing C and O constant

EXAMPLES

Now, the plasma etching method according to the second exemplary embodiment will be described in further detail with reference to some examples. However, it should be noted that the plasma etching method of the second exemplary embodiment is not limited to the following examples.

Comparative Example 2

In a comparative example 2, the etching process is performed on a processing target object as a sample of the wafer W. As the processing target object, one having the following structure is used. Further, the processing target object is placed on a test substrate on which a $SiO_2$ film is formed, and a WC chip is disposed around the processing target object on the test substrate. The etching process is performed under the conditions as follows.

(Processing Target Object)
    Etching target film: $SiO_2$ film
    Metal-containing film: WC film
    Mask film: $SiO_2$ film
(Etching Process)
    Processing gas and flow rates: $C_4F_6/CO/Ar/O_2$=10 sccm/ 300 sccm/1000 sccm/8 sccm
    Pressure: 4.3 Pa (30 mTorr)
    First radio frequency power HF: 100 W, continuous wave
    Second radio frequency power LF: 200 W, continuous wave
    DC voltage applied to upper electrode (gas shower head 25): −150 V, continuous wave
    Processing time: 180 sec Experimental Example 2

In an experimental example 2, the etching process is performed on the processing target object as the sample of the wafer W, and the radio frequency power applying process of applying the second radio frequency power LF intermittently is performed in the etching process. The etching process (and the radio frequency power applying process) are performed under the following conditions.
(Etching Process)
    Processing gas and flow rates: $C_4F_6/CO/Ar/O_2$=10 sccm/ 300 sccm/1000 sccm/8 sccm
    Pressure: 4.0 Pa (30 mTorr)
    First radio frequency power HF: 100 W, continuous wave
    Second radio frequency power LF: 1180 W, pulse wave (frequency: 0.1 kHz, duty ratio: 17%)
    DC voltage applied to upper electrode (gas shower head 25): −150 V, continuous wave
    Processing time: 235 sec
(Processing Results Regarding Comparative Example 2 and Experimental Example 2)

FIG. 6 is a diagram showing processing results of the comparative example 2 and the experimental example 2. FIG. 6 provides traced diagrams illustrating enlarged images of a top view and a cross section of each of the processing target object before being processed, the processing target object after the etching process in the comparative example 2 is performed, and the processing target object after the etching process (and the radio frequency power applying process) in the experimental example 2 is performed. Further, in FIG. 6, "Initial" represents the processing target object before being processed; "As LF CW etch," the processing target object after the etching process in the comparative example 2 is performed; and "As LF pulse etch," the processing target object after the etching process (and the radio frequency power applying process) in the experimental example 2 is performed.

Further, in FIG. 6, "Top CD" indicates an opening width of a formed recess, and "CD bias" represents a decrement of the opening width of the recess.

As depicted in FIG. 6, as compared to the comparative example 2 in which the second radio frequency power LF is continuously applied in the etching process, the decrement of the opening width of the recess is found to be diminished in the experimental example 2 in which the second radio frequency power LF is intermittently applied during the etching process. Further, an angle of the sidewall of the recess is found to be closer to a vertical angle in the experimental example 2, as compared to the comparative example 2.

The above-described exemplary embodiments include Remarks as follows.

(Remark 1)

A plasma etching method, comprising:

a protective film forming process of forming a protective film on a metal-containing film, which is formed on an etching target film and provided with a preset opening pattern, by a first processing gas; and an etching process of etching the etching target film by plasma generated from a second processing gas while using, as a mask, the metal-containing film on which the protective film is formed.

(Remark 2)

The plasma etching method of Remark 1 in which the protective film forming process and the etching process are alternately repeated at least twice.

(Remark 3)

The plasma etching method of Remark 1 in which a mask film is formed on the metal-containing film provided with the preset opening pattern, and the plasma etching method further comprises a pre-etching process of etching, before the protective film forming process, the etching target film by using the mask film as the mask until at least a part of a top surface of the metal-containing film is exposed.

(Remark 4)

The plasma etching method of Remark 1 or 2, further comprising: a patterning process of patterning, before the protective film forming process, the preset opening pattern on the metal-containing film formed on the etching target film, by using a mask film provided with the preset opening pattern as a mask.

(Remark 5)

The plasma etching method of Remark 3 in which an etching rate of the mask film is lower than an etching rate of the etching target film in the pre-etching process.

(Remark 6)

The plasma etching method of any one of Remarks 1 to 5 in which the etching target film is a silicon oxide film, a Low-k film or a silicon nitride film; the first processing gas includes $C_4F_6$, $C_4F_8$, $C_5F_8$, $CHF_3$, $CH_2F_2$ or $CH_4$; and the second processing gas includes $CF_4$ or $C_2F_6$.

(Remark 7)

The plasma etching method of any one of Remarks 1 to 5 in which the etching target film is a polysilicon film; the first processing gas includes $C_4F_6$, $C_4F_8$, $C_5F_8$, $CHF_3$, $CH_2F_2$ or $CH_4$; and the second processing gas includes $Cl_2$ or $NF_3$.

(Remark 8)

A plasma etching method, comprising:

an etching process of etching an etching target film by plasma generated from a deposition processing gas while using, as a mask, a metal-containing film formed on the etching target film and provided with a preset opening pattern; and a radio frequency power applying process of intermittently applying a radio frequency power for attraction of ions in the plasma for a period during which the plasma is being generated from the processing gas.

(Remark 9)

The plasma etching method of Remark 8 in which a mask film is formed on the metal-containing film provided with the preset opening pattern, and the plasma etching method further comprises a pre-etching process of etching, before the etching process, the etching target film by using the mask film as the mask until at least a part of a top surface of the metal-containing film is exposed.

(Remark 10)

The plasma etching method of Remark 8, further comprising: a patterning process of patterning, before the etching process, the preset opening pattern on the metal-containing film formed on the etching target film, by using a mask film provided with the preset opening pattern as a mask.

(Remark 11)

The plasma etching method of Remark 9 in which an etching rate of the mask film is lower than an etching rate of the etching target film in the pre-etching process.

(Remark 12)

The plasma etching method of any one of Remarks 8 to 11 in which the etching target film is a silicon oxide film, a Low-k film or a silicon nitride film; and the processing gas includes $C_4F_6$, $C_4F_8$, $C_5F_8$, $CHF_3$, or $CH_2F_2$.

(Remark 13)

The plasma etching method of any one of Remarks 8 to 11 in which the etching target film is a polysilicon film; and the processing gas includes HBr.

(Remark 14)

The plasma etching method of any one of Remarks 3 to 5 and 9 to 11 in which the mask film is a silicon oxide film, a silicon nitride film, a SiON film, a SiC film or a SiOC film.

(Remark 15)

The plasma etching method of any one of Remarks 1 to 14 in which the metal-containing film is a WC film or a TiN film.

(Remarks 16)

A plasma etching apparatus, comprising:

a chamber configured to perform a plasma etching process on a processing target object on which an etching target film and a metal-containing film provided with a preset opening pattern are stacked in sequence;

an exhaust unit configured to decompress an inside of the chamber;

a gas supply unit configured to supply a processing gas into the chamber; and a control unit configured to perform a protective film forming process of forming a protective film on the metal-containing film by a first processing gas, and a first etching process of etching the etching target film by plasma generated from a second processing gas while using, as a mask, the metal-containing film on which the protective film is formed.

(Remark 17)

A plasma etching apparatus, comprising:

a chamber configured to perform a plasma etching process on a processing target object on which an etching target film and a metal-containing film provided with a preset opening pattern are stacked in sequence;

an exhaust unit configured to decompress an inside of the chamber;

a gas supply unit configured to supply a processing gas into the chamber; and a control unit configured to perform a second etching process of etching the etching target film by plasma generated from a deposition processing gas while using the metal-containing film as a mask, and a bias power applying process of intermittently applying a bias power for attraction of ions in the plasma for a period during which the etching target film is being etched.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

I claim:

1. A plasma etching apparatus, comprising: a chamber; a gas supply unit configured to supply processing gas to the chamber; a plasma generator configured to generate plasma in the chamber; and a controller configured to cause: providing a substrate having a metal-containing mask provided with a preset opening pattern on an etching target film including silicon oxide film in the chamber; forming a fluoro-carbon protective film on the metal-containing mask provided with the preset opening pattern, using a first processing gas including a first fluoro-carbon gas and oxygen containing gas; and etching the silicon oxide film by plasma using a second processing gas including a second fluoro-carbon gas having a larger F ratio with respect to C than the first fluoro-carbon gas.

2. The plasma etching apparatus of claim 1,
wherein the controller is further configured to cause, repeating the forming of the fluoro-carbon protective film and the etching of the silicon oxide film alternately.

3. The plasma etching apparatus of claim 1,
wherein a mask film is formed on the metal-containing mask, and
the controller is further configured to cause, etching, before the forming of the fluoro-carbon protective film, the etching target film by using the mask film as a mask until at least a part of a top surface of the metal-containing mask is exposed.

4. The plasma etching apparatus of claim 1,
wherein the controller is further configured to cause, patterning, before the forming of the fluoro-carbon protective film, the preset opening pattern on the metal-containing mask by using a mask film provided with the preset opening pattern as a mask.

5. The plasma etching apparatus of claim 3,
wherein an etching rate of the mask film is lower than an etching rate of the etching target film.

\* \* \* \* \*